United States Patent [19]
Schmitt

[11] Patent Number: 5,972,117
[45] Date of Patent: Oct. 26, 1999

[54] METHOD AND APPARATUS FOR MONITORING GENERATION OF LIQUID CHEMICAL VAPOR

[75] Inventor: John Vincent Schmitt, Sunnyvale, Calif.

[73] Assignee: Applied Materials, Inc., Santa Clara, Calif.

[21] Appl. No.: 08/922,510

[22] Filed: Sep. 3, 1997

[51] Int. Cl.$^6$ .................................................. C23C 16/00
[52] U.S. Cl. .................... 118/726; 261/119.1; 261/121.1
[58] Field of Search .................................. 118/726, 708, 118/712; 261/119.1, 121.1

[56] References Cited

U.S. PATENT DOCUMENTS

| | | |
|---|---|---|
| 4,393,013 | 7/1983 | McMenamin . |
| 4,553,431 | 11/1985 | Nicolai . |
| 5,535,624 | 7/1996 | Lehmann . |
| 5,760,294 | 6/1998 | Lehmann . |

FOREIGN PATENT DOCUMENTS

| | | |
|---|---|---|
| 666340A1 | 3/1988 | European Pat. Off. . |
| 0460511 | 5/1991 | European Pat. Off. . |
| 3206130 | 2/1983 | Germany . |
| 3929506 | 9/1989 | Germany . |
| 0689038 | 6/1995 | Germany . |
| 60-212908 | 9/1985 | Japan . |

OTHER PUBLICATIONS

PCT search report issued in application No. PCT/US98/09702.
Guillot, A. and Dantzer, P., Determination of Volumes by Gas Expansion, Journal of Physics E/Scientific Instruments; vol. 19 (1986) Dec. No. 12, Woodbury NY, USA.
Search Report issued on Dec. 21, 1998 in PCT/US98/18451.
U.S. Patent Appln. Serial No. 09/094,401 filed Apr. 22, 1998 (Atty.Dkt. 1715/MD/PVD/DV).
U.S. patent application serial No. 08/928,371, filed Sep. 12, 1997 (Atty. Dk. # 2041/PVD/DV).
U.S. patent application serial No. 08/870,961, filed Jun. 6, 1997 (Atty. Dk. #1688/PVD/DV).
U.S. Serial No. 09/064,401 Jun. 30, 1998 Declaration of inventor, John V. Schmitt.

*Primary Examiner*—Richard Bueker
*Attorney, Agent, or Firm*—Konrad Raynes & Victor

[57] ABSTRACT

In a method and apparatus for producing a vapor containing a liquid chemical by bubbling a carrier gas through a mass of the liquid chemical, vapor production is monitored by: determining successive values of the pressure of the carrier gas being delivered to the mass of liquid chemical, over a time period; and calculating, on the basis of the successive values of the pressure, the frequency of bubble formation during the bubbling of the carrier gas.

31 Claims, 3 Drawing Sheets

5,972,117

METHOD AND APPARATUS FOR MONITORING GENERATION OF LIQUID CHEMICAL VAPOR

BACKGROUND OF THE INVENTION

The present invention relates to industrial chemical processes in which a processing chemical initially in the form of a liquid is converted to the vapor state, in which state it is conveyed to a processing station.

In many industrial chemical processes, a processing chemical is stored in a container in a liquid state and the supply of processing chemical in the container is gradually exhausted as the liquid is converted to a vapor and expelled from the container.

According to one technique currently employed for converting such a processing chemical into a vapor, a carrier gas is bubbled through the liquid processing chemical to produce the vapor, which is then conveyed to a processing chamber, normally with the aid of a pump. This technique is currently employed in chemical vapor deposition (CVD) systems employing, as the processing chemical, a liquid chemical such as DMAH, TDMAT, TEOS, etc.

The carrier gas is injected at some point below the surface of the liquid chemical, usually at a point near the bottom of the container in which the chemical is stored. Upon being introduced into the liquid chemical body, the carrier gas forms discrete bubbles which rise to the surface of the liquid body. Each bubble will contain a quantity of the liquid chemical in vapor form. Thus, when the bubbles emerge from the surface of the body of liquid, they provide a quantity of vapor which is then removed from the region above the liquid body. removed from the region above the liquid body.

A number of characteristics of the resulting deposition process are often highly sensitive to any changes in the composition of the liquid chemical or the rate at which it is delivered in vapor form to the process chamber. For example, liquid chemicals employed in processes of the type referred to above can undergo a change in viscosity within their storage container as a result of having become contaminated, or having experienced distillation, precipitation, or polymerization. The resulting change in chemical composition, or quality, can alter the composition or quality of the resulting deposited film in an unacceptable manner. Moreover, changes in the rate at which the chemical is vaporized within its container can cause corresponding changes in the deposition rate, which may also be undesirable.

Measurement of such changes in the liquid chemical could allow such undesirable changes in the resulting deposited film to be anticipated and corrected. However, the nature of many of the chemicals in question, and particularly their high level of corrosivity has often prevented effective measurements from being made by conventional measuring techniques and instruments.

Thus, although it is already known that at least a rough estimate of the viscosity of a liquid chemical can be obtained by visual observation of the bubbles being produced by a carrier gas, such visual observation from an external vantage point usually requires that at least a portion of the liquid chemical container be transparent. However, because of the hazardous nature of many of the chemicals of the type here under consideration, containers which are made in whole or in part of transparent materials may not provide the requisite degree of safety in such applications. Alternatively, the corrosive or sensitive nature of many of these chemicals renders impractical the placement of optical or other instruments inside the container where the chemicals can either corrode the instruments or be contaminated by the instruments.

SUMMARY OF THE INVENTION

It is an object of the present invention to monitor the rate at which vapor is produced in a liquid chemical reactant container in a safe and effective manner.

A more specific object of the invention is to effect such monitoring by performing measurements at locations which are not exposed to the corrosive chemical vapor.

A further specific object of the invention is to derive indications of various parameters of the vapor generation operation on a real time basis.

The above and other objects are achieved, according to the present invention, in a method and apparatus for producing a vapor containing a liquid chemical by bubbling a carrier gas through a mass of the liquid chemical, by:

determining successive values of the pressure of the carrier gas being delivered to the mass of liquid chemical, over a time period; and calculating the mass flow rate of said vapor from said mass of liquid chemical, based on the successive values of said pressure of said carrier gas determined in said determining step.

One aspect of the invention is based to a substantial extent on the inventor's recognition that the pressure of the carrier gas being delivered to the mass of liquid chemical varies as a function of the bubble formation mechanism. As a bubble is being generated at the outlet end of a carrier gas delivery pipe, the pressure will rise; when the bubble is released from the outlet end of that pipe, the pressure will drop. Thus, the generation of each bubble is associated with one cycle of pressure variation. By measuring the frequency of these pressure variation cycles, the rate of bubble formation can be determined. The bubble formation rate can, in turn, be used to calculate indications of effective bubble size and mass as well as the mass flow rate of vapor from the liquid chemical.

For example, the mass of carrier gas per bubble can be calculated by dividing an indication of the carrier gas flow rate by the measured frequency. The calculated mass of carrier gas per bubble can then be utilized to calculate a value for equivalent spherical bubble size, i.e., the size that each bubble would have at the pressure and temperature of the gas, using the average value of the measured carrier gas pressure and the existing temperature within the liquid chemical container.

In addition, the pressure within the container can be calculated on the basis of the average pressure of the carrier gas and pressure drops within the apparatus which will affect the pressure within the container, such pressure drops being assumed to be constant and being determined in advance by preliminary pressure measurements or on the basis of the configuration of the particular apparatus to which the invention is applied. Even if this calculation does not produce an exact indication of the pressure within the container, it is believed that the pressure calculated on this basis will vary in accordance with the actual pressure within the container. Therefore, this calculated container pressure can provide a highly useful indication of net changes in the container pressure, which changes can be indicative of the development of obstructions in the vapor flow path from the container to the process chamber.

The resulting derived values can then serve to provide indications of changes in viscosity of the liquid chemical, vapor creation rate and the condition of the vapor flow path between the container and the process chamber.

A decrease in the bubble rate can provide an indication that the viscosity of the liquid chemical has increased, while a larger mass per bubble or equivalent spherical bubble size can indicate a reduction in surface area to mass ratio, corresponding to a reduced vaporization rate, and an increase in the average pressure within the container can indicate that obstructions are developing along the flow path from the container to the process chamber. The latter two conditions often result in reductions in the rate of deposition of a layer or film on a substrate within the process chamber.

DETAILED DESCRIPTION OF THE INVENTION

Figure 1:
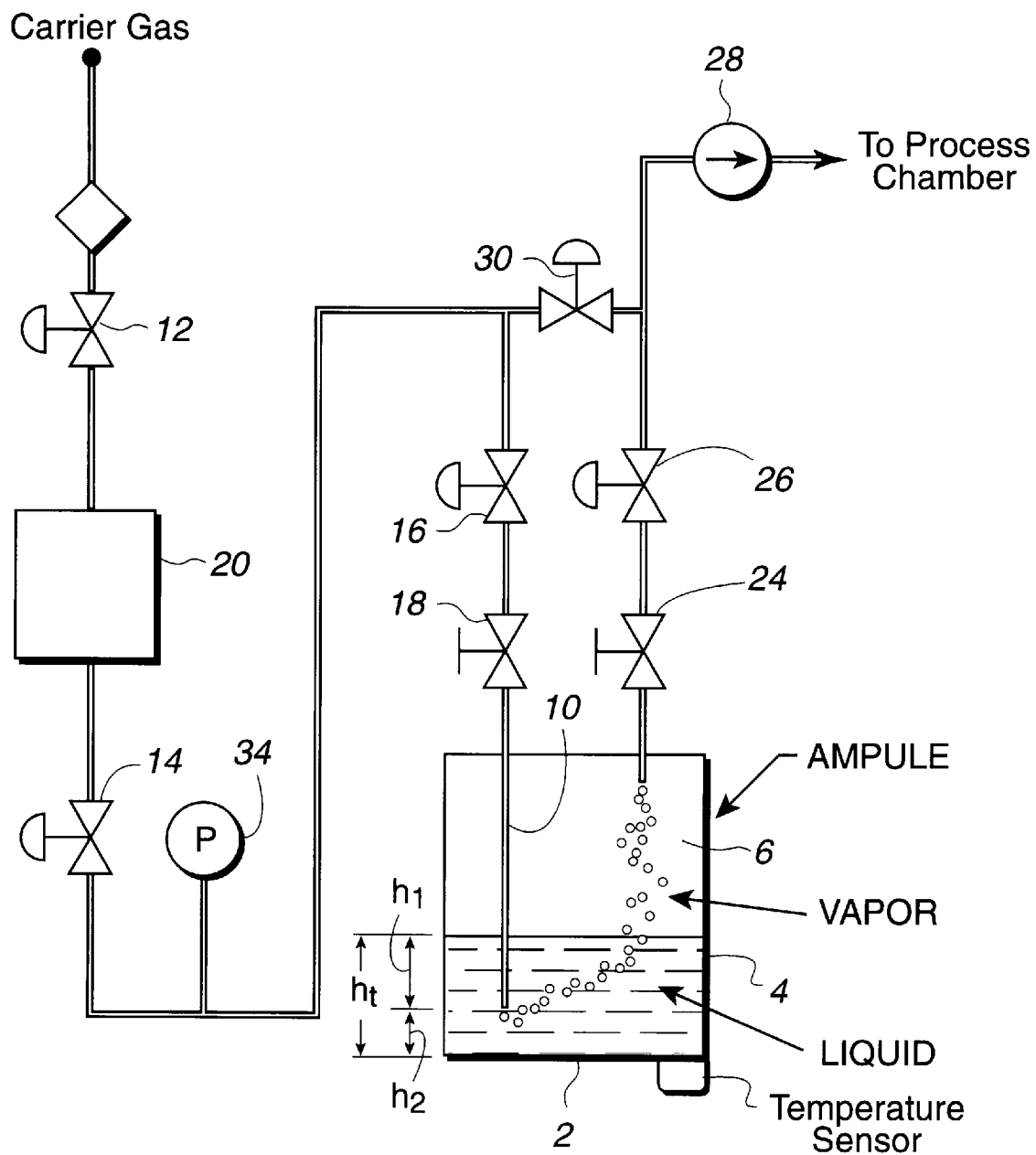
FIG. 1 is a block diagram illustrating one exemplary embodiment of apparatus to which the present invention may be applied.

FIG. 1 illustrates a typical vapor supply system to which the present invention may be applied.

A mass 2 of a liquid chemical is stored in a container, or ampule, 4 which, depending upon the nature of the liquid chemical, may be required to be completely opaque. In addition, the container 4 may be completely sealed except for inlet and outlet passages. A vapor space 6 exists within container 4 above liquid mass 2. An inlet pipe 10 extends into container 4 via an inlet opening at the top of container 4. Pipe 10 has an outlet end which is preferably located slightly above the bottom of container 4 to be immersed in liquid mass 2 until that mass is almost completely exhausted.

Carrier gas is delivered to inlet pipe 10 via a flow path which includes controllable valves 12, 14, 16 and 18, and a mass flow controller 20 which controls the rate at which gas flows through the path.

Carrier gas exiting the outlet end of pipe 10 produces bubbles within liquid mass 2. The bubbles will contain a quantity of liquid chemical in a vapor state, and when the bubbles reach the surface of liquid mass 2, the vapor will enter vapor space 6. Vapor present within space 6 is delivered to a process chamber (not shown) over an outlet path connected to an outlet opening at the top of container 4. The outlet path, or vapor flow path, includes controllable valves 24 and 26 and an outlet pump 28. In an exemplary conventional process chamber, the vapor would be introduced into the chamber via an arrangement which includes a vapor deflection plate and a perforated plate, or "shower head", through which the vapor is introduced into the chamber.

A further controllable valve 30 is provided between the inlet path and the outlet path, downstream of valve 26, to allow pure carrier gas to be introduced into the process chamber, for example when the interior of the chamber is to be purged.

All of the components described thus far may be found in conventional systems for delivering a processing chemical vapor to a process chamber.

According to one aspect of the invention, a pressure sensor 34 is connected at a point along the gas inlet path in order to provide a signal representative of the pressure within that inlet path. This pressure will be closely related to the pressure at the outlet end of pipe 10, differing therefrom essentially only by the pressure drop between the location at which sensor 34 is connected and the outlet end of pipe 10. It is believed that, in general, this pressure drop will be relatively small and constant and will likely not, in most applications, have a significant effect on the parameters to be derived in accordance with the illustrated embodiment. Pressure sensor 34 can be connected at any point between the outlet of mass flow controller 20 and the inlet of valve 18. It is preferred that sensor 34 not be disposed downstream of valve 18 because valve 18 will typically be an integral part of container 4 and will be removed from the system along with container 4 when the liquid chemical within that container has been exhausted and a new container must be installed.

In the illustrated embodiment, the pressure sensor 34 is a capacitance manometer type sensor manufactured by MKS, Series 852. Of course, other types of pressure sensors may be used, depending upon the application.

Because pressure sensor 34 is located upstream of the outlet end of pipe 10, it will be subjected to little or no contamination or corrosion by the liquid chemical.

As is known in the art, mass flow controller 20 may be associated with a flow rate detecting device which can provide a signal representative of the rate of flow of carrier gas therethrough.

Figure 2:
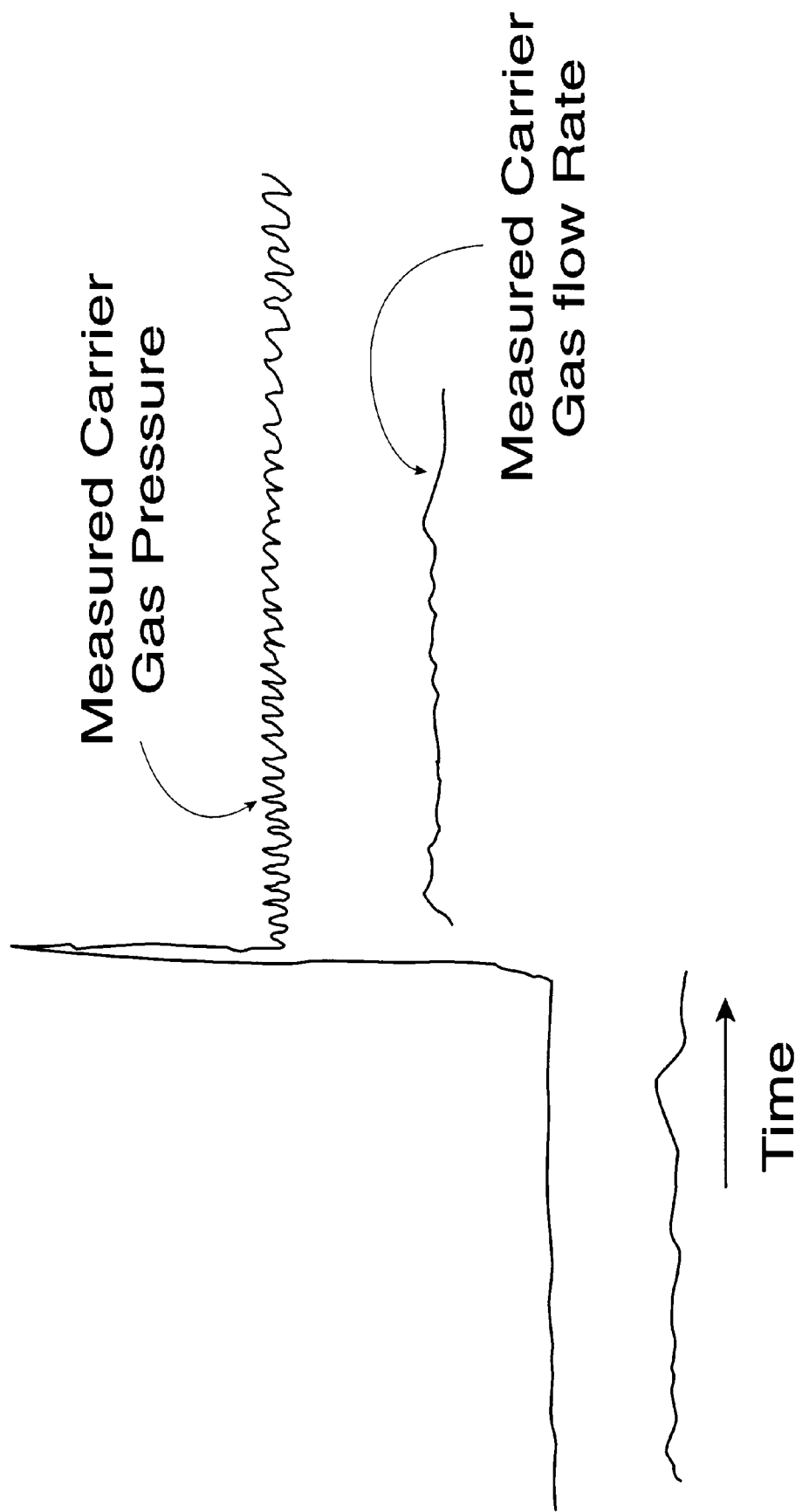
FIG. 2 is a diagram illustrating typical patterns of gas pressure and flow rate which are measured according to the invention.

FIG. 2 illustrates, essentially on a qualitative basis, the pattern of carrier gas pressure variation which has been found to be measured by pressure sensor 34 and the pattern of measured carrier gas flow rate derived from a flow rate sensor associated with mass flow controller 20.

Initially, as shown in FIG. 2, the gas pressure and flow rate are not sufficient to initiate the generation of bubbles. When vapor is to be delivered to the process chamber, the gas flow rate is increased, producing a corresponding increase in carrier gas pressure. When an appropriate pressure value is achieved, bubble formation is initiated. It has been observed that during bubble formation, carrier gas pressure varies in a cyclic manner and that this variation is a result of bubble formation, as described earlier herein. Each cycle of variation is believed to be associated with a generation of one bubble. Thus, the formation of an individual bubble may be monitored without any optical sensors either in or outside the container 4.

By measuring the frequency of these cyclic variations in the gas pressure value, an indication of the rate of bubble formation can be obtained. Furthermore, by dividing the measured carrier gas flow rate by this frequency, the mass of carrier gas per bubble can be determined. Further calculations can then lead to a determination of equivalent spherical bubble size. In addition, the average value of the measured carrier gas pressure during bubbling can be derived and utilized to provide an indication of the pressure within container 4.

Figure 3:
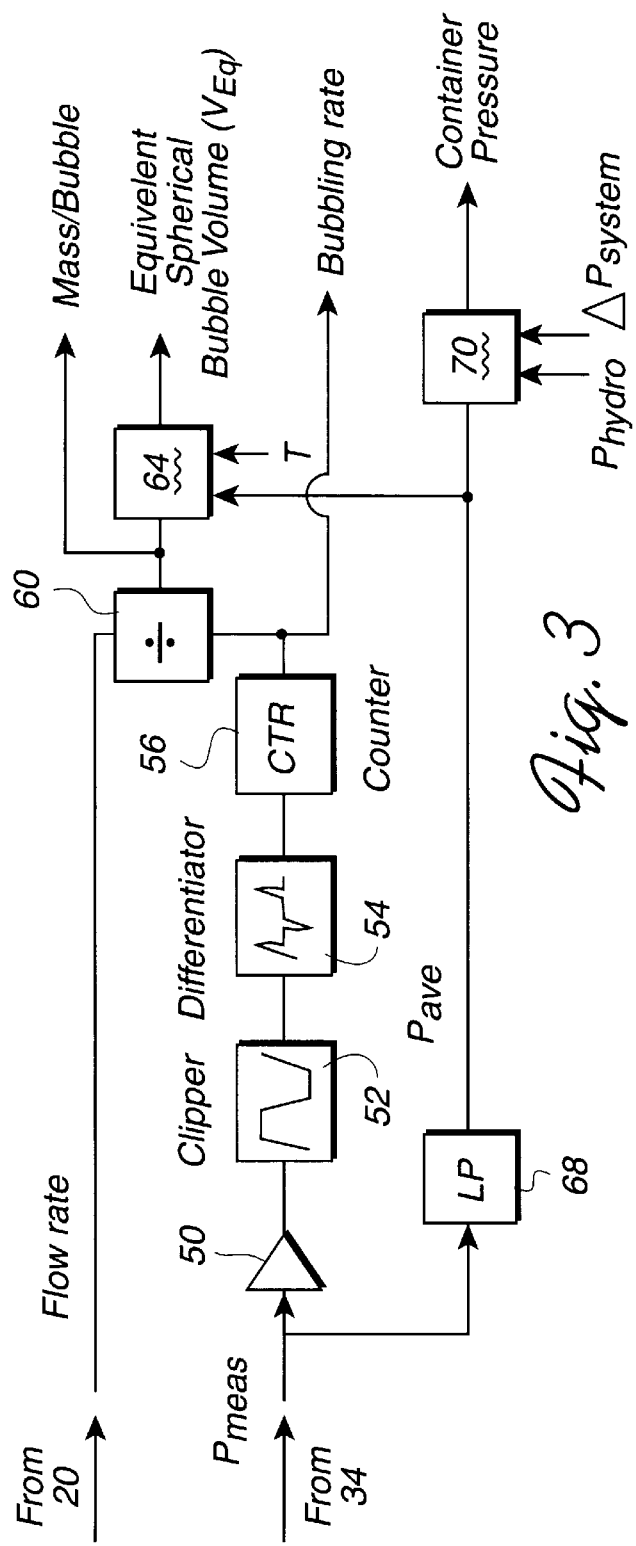
FIG. 3 is a block diagram of a system for calculating process parameters according to the invention.

One suitable system which can be employed to perform the necessary calculations is Illustrated in FIG. 3. It is to be understood, however, that the illustrated arrangement only represents a non-limiting example and that a large number of different arrangements are possible. In addition, by conversion of the measured gas pressure and gas flow rate values to digital form, it is anticipated that all of the calculation operations can be performed in any general purpose computer under control of a program that can be readily written by any competent programmer on the basis of knowledge existing in the art.

In the examples shown in FIG. 3, a signal $P_{meas}$ representing the pressure being measured over a period of time is delivered from pressure sensor 34 to an amplifier 50 which simply serves to amplify the gas pressure signal containing low amplitude cyclic variations. The amplified signal from amplifier 50 is delivered to a clipper 52 which, in a known manner, converts the amplified signal to a cyclic signal approximating a square wave. The signal from clipper 52 is then delivered to a differentiator 54 which produces a series of pulses, each pulse being produced by a rising or falling edge of the clipped signal from clipper 52. The output of differentiator 54 is supplied to a counter 56 which, by having its output suitably clocked, will provide an output representative of the pulse rate of the signal from differentiator 54.

It should be appreciated that differentiator 54 can be constructed to generate pulses derived from either the leading edges only or the trailing edges only of the signal from clipper 52, so that the pulse rate will be equal to the frequency of the measured carrier gas pressure. Alternatively, counter 56 can be readily constructed to count only positive or negative pulses in the output from differentiator 54.

Counter 56 can be controlled in a conventional manner by a succession of reset clock pulses, at a rate which is a fraction of the minimum anticipated bubbling rate. Each reset clock pulse can be used to trigger readout of the current count value from counter 56, followed by resetting of counter 56 to a zero count state. In this way, counter 56 can provide a sufficiently accurate indication of the existing bubbling rate, essentially on a real time basis.

The count output from counter 56 is delivered to a divider 60 along with a signal indicating the carrier gas flow rate, derived from an appropriate sensor associated with mass flow controller 20. The resulting output from divider 60 is a signal representative of the mass of carrier gas per bubble.

This output from divider 60 is also supplied to a calculating unit 64. Unit 64 additionally receives an input Pave representing the average value of the pressure being measured by sensor 34. This average value can be derived in a simple manner by applying the pressure signal from sensor 34 to a low pass filter 68 whose output will have a value representative of the average value of the measured gas pressure. Calculating unit 64 additionally receives a signal T representing the temperature within container 4. This temperature is monitored by a variety of devices utilized in known bubbling systems, such a device being shown schematically in FIG. 1. Within calculating unit 64, equivalent spherical bubble size can be calculated according to classic ideal gas laws. It should be pointed out that it is not known whether the bubbles are, in fact, spherical, but a determination of the equivalent spherical bubble size is believed to be useful in deriving an indication of the vapor generation rate.

The signal $P_{ave}$ representing average gas pressure is additionally supplied to a second calculating unit 70 which also receives separately generated inputs $P_{hydro}$ and $\Delta P_{system}$ representing, respectively, the hydrostatic pressure within container 4 and system pressure drop to provide a signal indication of the pressure within the container 4. The hydrostatic pressure is representative of the level of liquid mass 2 within container 4 and can be derived by a separate pressure sensor associated with container 4. Since, however, the association of a pressure sensor with the interior of container 4 may not be desirable, given that the performance of any pressure sensor can be impaired by the corrosive liquid chemical vapor, an input signal representative of hydrostatic pressure can be omitted. Calculations have shown that omission of this input will have only approximately a 5 percent influence on the accuracy of the resulting calculation.

The signal $\Delta P_{system}$ representing system pressure drop between the sensor 34 and the container 4 can be measured before the apparatus is placed into operation, since this value is generally constant during system operation.

The calculation performed within unit 70 can be in accordance with the following equation:

$$P_{container}=P_{ave}-P_{hydro}-\Delta P_{system}.$$

The resulting output signals representing mass of carrier gas per bubble, equivalent spherical bubble size, bubbling rate and container pressure can then be supplied to suitable visual indicators or can be displayed on a computer monitor. The resulting indications can then be utilized by an operator to identify developing problems. Alternatively, one or a combination of the output signals can be supplied to a suitable alarm system that will provide an alarm signal when a measured value departs from an acceptable range or a particular combination of measured values depart from acceptable ranges.

Provision of visual indicators and alarms as described above in accordance with the present invention can assist the operator in detecting and correcting drifts in the process performance before such drift can degrade the process performance to unacceptable levels. Still further, potentially hazardous conditions can be detected early before reaching dangerous levels. For example, a detected change in the viscosity of the liquid chemical may indicate that the liquid chemical is undergoing chemical changes. These chemical changes and the attendant viscosity change can in turn indicate that a blockage in the flow path will soon begin to develop. Such a blockage, if undetected, can lead to a potentially hazardous pressure build-up. Thus, by detecting bubble frequency to detect a viscosity change, imminent blockages can be detected and corrected before they become hazardous.

In digital implementations of a system for deriving the parameter values represented in FIG. 3, analog/digital converters can be connected to the output of the flow rate sensor in controller 26, if the sensor output is not already in digital form, and to the output of low pass filter 68. These converters can be clocked, along with units 60, 64 and 70, to generate updated parameter values at a sufficient rate. It will be appreciated that a satisfactory update rate for purposes of the present invention will be well within the capabilities of available digital devices. The construction details of such a digital system will be readily apparent to those of ordinary skill in the data processing arts.

It is preferred that the system of the illustrated embodiment be operated at a vaporization level below saturation, that is, at a rate below that where the amount of vapor condensation equals the amount of vaporization in the interior of the container 4. In this unsaturated mode, the rate of mass flow, $m_v$, of vapor from container 4 can be calculated based on a determination of current equivalent spherical bubble and bubble frequency. For example, m, may be calculated using the following equation:

$$m_v=k_v(A_0+(A_B \cdot t \cdot f_B)),$$

where:
$k_V$ is the rate of vaporization per unit surface area of the liquid chemical in container 4;

$A_O$ is the surface area of the mass of liquid chemical stored in container 4;

$A_B$ is the area of the surface of each equivalent spherical bubble;

$t_r$ is the residence time of each bubble in liquid chemical mass 2; and $f_B$ is the bubbling rate.

The value of $A_O$ is determined simply by measuring the area of the bottom of the interior of container 4, assuming the interior to enclose a space of constant horizontal cross-sectional area such as a cylindrical space, for example.

The value of $k_v$ can be determined experimentally, before the apparatus is placed into operation, by blocking flow of carrier gas to inlet pipe 10, pumping vapor to the process chamber, measuring the weight loss rate of container 4, i.e. the weight loss per unit time, and dividing the weight loss rate by $A_O$. Such determination can be made at different temperatures. Then, when the apparatus is in operation, the temperature within container 4 can be determined, or can be assumed, and the value of $k_v$ which was determined for that temperature can be used in the vapor flow rate calculation.

The value of the bubble surface area, $A_B$, is calculated on the basis of the relationship between the volume and surface area of a sphere, i.e. the surface area is equal to the volume multiplied by $3/r$, where r is the radius of the equivalent spherical bubble.

The value of the bubble residence time, $t_r$, will be primarily a function of the level of the surface of liquid mass 2 above the outlet end of pipe 10 and the viscosity of the liquid chemical. For purposes of the present invention, it is assumed that the viscosity undergoes negligible variations while the liquid chemical is being dispensed. Thus, $t_r$ can be expressed as a function of the above-mentioned liquid mass level.

The value of $t_r$ can be determined in a number of ways prior to monitoring a vapor generation operation. For example, the chemical substance can be placed in a transparent container (under appropriate safety conditions), typically of quartz, which is maintained at the temperature at which the chemical substance is maintained during normal vapor production. Gas is then bubbled through the chemical and the travel time of a bubble from the time it is launched from pipe 10 until it attains the surface is determined simply by observing a bubble and measuring its travel time with the aid of a stopwatch. Alternatively, the chemical substance can be photographed through the transparent container during bubble production. On the resulting photograph, the number of bubbles present in the liquid at a given instant can be counted. The travel time for one bubble will then be equal to the number of bubbles visible on the photograph divided by the bubbling rate, $f_B$.

The travel time measurement operation may be performed at a number of different liquid mass quantities, or levels, in the container. Based on the resulting travel time measurements, a sufficiently accurate approximation of the function relating bubble travel time to liquid mass level can be readily derived. This function may be a constant or a variable.

Then, during monitoring of the vapor supply system during performance of an industrial chemical process, the level of the mass 2 in container 4 is measured periodically and the resulting measured value is used to calculate the current value for residence time, $t_r$.

Measurement of the level of mass 2 can be performed, for example, on the basis of the liquid quantity measuring procedure disclosed in copending U.S. application Ser. No. 08/870,961, filed Jun. 6, 1997 by John V. Schmitt and Richard A. Marsh, entitled MEASUREMENT OF QUANTITY OF INCOMPRESSIBLE SUBSTANCE IN A CLOSED CONTAINER, Attorney Docket No. 1688/PVD/DV. The procedure disclosed in that application produces a measurement of the total quantity of liquid in a closed container. The measured quantity in turn indicates the level of the liquid in the container. For example, in a container having a constant horizontal cross-sectional area, by dividing the total quantity value by the horizontal cross-sectional area of the interior of the container, $A_O$, a value for the level of the surface of liquid mass 2 above the container bottom will be obtained. Subtracting the height of the outlet end of pipe from the container bottom yields the height of the surface level of liquid mass 2 above the outlet end of pipe 10. This is the height of liquid through which each bubble rises.

Referring back to FIG. 1, the height, $h_t$, of the surface of liquid mass 2 above the container bottom is equal to the sum of the vertical distance, $h_2$, between the outlet end of pipe 10 and the container bottom, and the vertical distance, $h_1$, between the outlet end of pipe 10 and the surface of liquid mass 2. If the current value for $h_t$ is derived in the manner described above, based on the quantity measurement procedure disclosed in the above-cited copending application, and since the value of $h_2$ will be known from container fabrication specifications, then:

$$h_1 = h_t - h_2,$$

and $$t_r = f(h_1).$$

Based on the preliminary measurements described earlier herein, the value of $f(h_1)$ can be determined.

The liquid quantity measuring procedure disclosed in the above-cited copending application can be performed periodically, for example during wafer exchange in a CVD chamber. This can provide sufficiently frequent updates of $t_r$ to allow the current mass flow rate to be calculated with acceptable accuracy for many applications. One advantage of utilizing this procedure is that pressure measurements can be made with pressure sensor 34, which is already provided in a system according to the invention.

Figure 4:
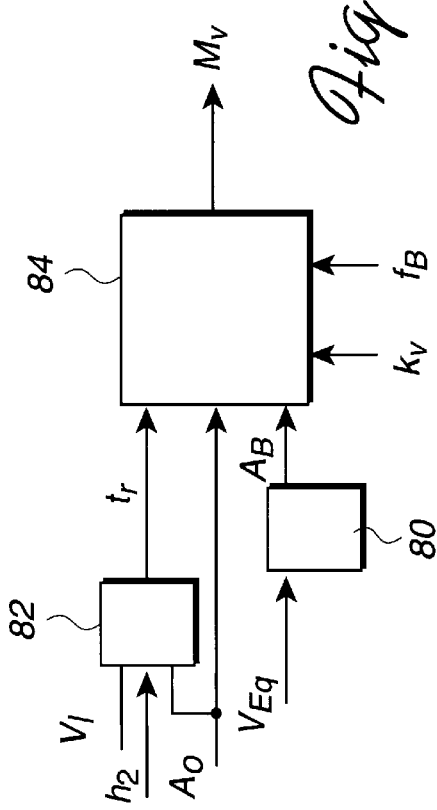
FIG. 4 is a block diagram of a system for calculating vapor mass flow rate according to the invention.

A system for calculating the vapor mass flow rate, $m_v$, can be constructed in accordance with principles well known in the art. This system, like that shown in FIG. 3, can be implemented in analog or digital form, or by programming a digital computer. An exemplary embodiment of such hardware is shown in FIG. 4

A first calculating unit 80 receives the current calculated values of the equivalent spherical bubble volume, $V_{Eq}$, and calculates the bubble surface area, $A_B$, by first deriving the value for the bubble radius, r, i.e., $$r = \sqrt[3]{\frac{3 \cdot V_{Eq}}{4\pi}}$$

and then deriving $A_B = 4\pi r^2$.

A second calculating unit 82 receives the currently calculated value of the quantity of liquid, $V_1$, in container 4 and stored values for $h_2$ and $A_O$. Unit 82 is configured to perform a calculation according to $f(h_1)$. This unit 82 performs the following calculations:

$$h_t = V_1/A_O;$$

$$h_1 = h_t - h_2;$$

$$t_r = f(h_1),$$

The resulting calculated values of the bubble surface area $A_B$ and bubble residence time $t_r$ are delivered to a second calculating unit 84 along with previously calculated and stored values for $k_v$, and $A_0$ and the current calculated value of $f_B$, from which the current value of the mass flow rate, $m_v$, is calculated according to the equation provided hereabove.

While particular embodiments of the present invention have been shown and described, it will be understood by those skilled in the art that changes and modifications may be made without departing from this invention in its broader aspects and, therefore, the aim in the appended claims is to cover all such changes and modifications as fall within the true spirit and scope of this invention.

I claim:

1. In a method for producing a vapor by bubbling a carrier gas through a mass of liquid, the improvement comprising:

determining successive values of said pressure of said carrier gas being delivered to said mass of liquid over a time period; and calculating the mass flow rate of said vapor from said mass of liquid, based on the successive values of said pressure of said carrier gas determined in said determining step.

2. The method according to claim 1 wherein said carrier gas is introduced into said mass of liquid below the surface of said mass of liquid, and further comprising:

preliminarily determining the travel time of said carrier gas through said mass of liquid; and using the determined travel time in said calculating step.

3. The method according to claim 2, wherein said calculating step is performed according to the following equation:

$$m_v = k_v(A_0 + (A_B \cdot t_r \cdot f_B)),$$

where:

$k_v$ is the rate of vaporization per unit surface area of the liquid in a container;

$A_0$ is the surface area of the mass of liquid stored in said container;

$A_B$ is the area of the surface of each equivalent spherical bubble;

$t_r$ is the residence time of each bubble in said liquid mass; and $f_B$ is the bubbling rate.

4. In a method for producing a vapor by bubbling a carrier gas through a mass of liquid, the improvement comprising:

determining successive values of said pressure of said carrier gas being delivered to said mass of liquid, over a time period; and detecting, on the basis of said successive values of said pressure, the formation of a bubble during said bubbling of said carrier gas.

5. A processing method comprising:

producing a vapor by bubbling a carrier gas through a mass of liquid;

determining successive values of the pressure of said carrier gas being delivered to said mass of liquid over a time period; and calculating, on the basis of said successive values of said pressure, the frequency of bubble formation during said bubbling of said carrier gas.

6. The method according to claim 5, further comprising:

providing an indication of said calculated frequency of bubble formation.

7. The method according to claim 5, further comprising:

determining the rate of flow of carrier gas to said mass of liquid; and calculating the quantity of carrier gas per bubble by dividing a representation of said rate of flow of carrier gas by said calculated frequency of bubble formation.

8. The method according to claim 7, further comprising:

providing an indication of said calculated quantity of carrier gas per bubble.

9. The method according to claim 7, wherein said mass of said liquid is stored in a container, and further comprising:

determining the average value of said pressure of said carrier gas; and calculating the pressure in said container as a function of said determined average pressure of said carrier gas.

10. The method according to claim 9, further comprising:

providing an indication of said calculated pressure in said container.

11. The method according to claim 7, wherein said mass of said liquid is stored in a container, and further comprising:

determining the average value of said pressure of said carrier gas;

determining the temperature within said container; and calculating the size of spherical bubbles equivalent to bubbles formed in said mass of liquid as a function of said calculated quantity of carrier gas per bubble, said determined average value of said pressure of said carrier gas and said determined temperature within said container.

12. The method according to claim 11, further comprising:

providing an indication of said calculated size of spherical bubbles.

13. In an apparatus for producing a vapor by bubbling a carrier gas through a mass of liquid in a container, the improvement comprising:

a pressure sensor adapted to provide successive values indicative of the pressure of said carrier gas being delivered to said mass of liquid, over a time period; and means coupled to said pressure sensor for calculating the mass flow rate of said vapor from said mass of liquid, based on the successive values of said pressure of said carrier gas provided by said pressure sensor.

14. The apparatus according to claim 13 wherein said means for calculating calculates according to the following equation:

$$m_v = k_v(A_0 + (A_B \cdot t_r \cdot f_B)),$$

where:

$k_v$ is the rate of vaporization per unit surface area of the liquid in said container;

$A_0$ is the surface area of the mass of liquid stored in said container;

$A_B$ is the area of the surface of each equivalent spherical bubble;

$t_r$ is the residence time of each bubble in said mass of liquid; and $f_B$ is the bubbling rate.

15. In an apparatus for producing a vapor by bubbling a carrier gas through a liquid chemical, the improvement comprising:

a pressure sensor adapted to provide successive values indicative of the pressure of said carrier gas being delivered to said liquid chemical, over a time period; and a detector responsive to said successive values of said pressure sensor to detect the formation of an individual bubble during said bubbling of said carrier gas.

16. The apparatus according to claim 15 wherein said detector includes a differentiator for differentiating said successive values of said pressure sensor.

17. In an apparatus for producing a vapor by bubbling a carrier gas through a liquid, the improvement comprising:

a pressure sensor adapted to provide successive values indicative of the pressure of said carrier gas being delivered to said mass of liquid, over a time period; and a frequency detector responsive to said successive values of said pressure sensor to detect the frequency of bubble formation during said bubbling of said carrier gas.

18. The apparatus according to claim 17 wherein said frequency detector includes a differentiator responsive to said pressure sensor for differentiating said successive values of said pressure sensor and to provide a signal indicative of the formation of a bubble during said bubbling of said carrier gas, and a counter responsive to said differentiator signal for counting said bubble formations.

19. In an apparatus for producing a vapor by bubbling a carrier gas through a liquid, the improvement comprising:

means for determining successive values of the pressure of said carrier gas being delivered to said liquid, over a time period; and means for calculating, on the basis of said successive values of said pressure, the frequency of bubble formation during said bubbling of said carrier gas.

20. The apparatus according to claim 19, further comprising:

means for providing an indication of said calculated frequency of bubble formation.

21. The apparatus according to claim 19, further comprising:

means for determining the rate of flow of carrier gas to said mass of liquid; and means for calculating the quantity of carrier gas per bubble by dividing a representation of said rate of flow of carrier gas by said calculated frequency of bubble formation.

22. The apparatus according to claim 21, further comprising:

means for providing an indication of said calculated quantity of carrier gas per bubble.

23. The apparatus according to claim 21, wherein said liquid is stored in a container, and further comprising:

means for determining the average value of said pressure of said carrier gas; and means for calculating the pressure in said container as a function of said determined average pressure of said carrier gas.

24. The apparatus according to claim 23, further comprising:

means for providing an indication of said calculated pressure in said container.

25. The apparatus according to claim 23, wherein said liquid is stored in a container, and further comprising:

means for determining the average value of said pressure of said carrier gas;

means for determining the temperature within said container; and means for calculating the size of spherical bubbles equivalent to bubbles formed in said mass of liquid as a function of said calculated quantity of carrier gas per bubble, said determined average value of said pressure of said carrier gas and said determined temperature within said container.

26. The apparatus according to claim 25, further comprising:

means for providing an indication of the calculated size of spherical bubbles.

27. The method according to claim 5, further comprising delivering said vapor to a processing chamber.

28. The method according to claim 9, further comprising determining the level of said liquid present in said container.

29. A processing method comprising:

providing a container housing a liquid chemical;

bubbling a carrier gas through a volume of said liquid to form said vapor;

determining successive values of said pressure of said carrier gas being delivered to said volume of liquid chemical, over a time period;

calculating the mass flow rate of said vapor from said volume of liquid chemical, based on the successive values of said pressure of said carrier gas determined in said determining step.

30. A method as in claim 29, further comprising delivering said vapor to a processing chamber.

31. A processing system for producing and utilizing a vapor by bubbling a carrier gas through a liquid chemical, said system comprising:

a container housing a liquid chemical therein; said container including an inlet for said carrier gas and an outlet for said vapor;

a pressure sensor adapted to provide successive values indicative of the pressure of said carrier gas being delivered to said liquid chemical over a time period;

a detector responsive to said successive values of said pressure sensor to detect the formation of an individual bubble during said bubbling of said carrier gas; and a processing chamber coupled to said outlet.

* * * * *